US012241478B2

(12) United States Patent
He (10) Patent No.: US 12,241,478 B2
(45) Date of Patent: Mar. 4, 2025

(54) FAN WITH ELEVATED MECHANICAL SUPPORT FOR NO-BOTTOM-VENT SYSTEMS

(71) Applicant: Dell Products L.P., Round Rock, TX (US)

(72) Inventor: Qinghong He, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 18/340,061

(22) Filed: Jun. 23, 2023

(65) Prior Publication Data

US 2024/0426317 A1 Dec. 26, 2024

(51) Int. Cl.
*F04D 29/42* (2006.01)
*F04D 17/02* (2006.01)
*H05K 7/20* (2006.01)

(52) U.S. Cl.
CPC ....... *F04D 29/4226* (2013.01); *F04D 17/025* (2013.01); *H05K 7/20172* (2013.01)

(58) Field of Classification Search
None
See application file for complete search history.

(56) References Cited

U.S. PATENT DOCUMENTS

| 9,332,679 | B2 * | 5/2016 | Carl, Jr. | H05K 7/20772 |
| 10,511,201 | B2 * | 12/2019 | Kim | H02K 21/24 |
| 10,927,848 | B2 * | 2/2021 | Chen | H05K 7/20145 |
| 11,746,798 | B2 * | 9/2023 | Hsu | F04D 25/0613 |
| | | | | 415/203 |
| 2013/0044430 | A1 * | 2/2013 | Carl, Jr. | H05K 7/20172 |
| | | | | 361/695 |
| 2019/0013712 | A1 * | 1/2019 | Kim | H02K 3/26 |
| 2019/0301485 | A1 * | 10/2019 | Chen | F04D 25/08 |
| 2022/0163051 | A1 * | 5/2022 | Hsu | F04D 29/4226 |

OTHER PUBLICATIONS

Huang et al (CN 113280004 A) + machine translation (Year: 2021).*

* cited by examiner

*Primary Examiner* — Juan G Flores
(74) *Attorney, Agent, or Firm* — McDermott Will & Emery LLP (57) ABSTRACT

In one or more embodiments, one or more systems may comprise a fan housing for use in a portable chassis without a vent on a bottom cover. A plurality of tabs located proximate an opening in the bottom wall extend axially to provide support. In some embodiments, a disc is coupled to the plurality of tabs. In some embodiments, a ring is coupled to the plurality of tabs, wherein deflection of the ring positions the ring relative to a fan hub.

6 Claims, 6 Drawing Sheets

FAN WITH ELEVATED MECHANICAL SUPPORT FOR NO-BOTTOM-VENT SYSTEMS

BACKGROUND

Field of the Disclosure

This disclosure relates generally to chassis for information handling systems and more particularly to improving cooling in chassis with no bottom vent designs.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Embodiments may be directed to a fan assembly, comprising a fan hub coupled to a plurality of fan blades and a fan housing comprising a first wall for supporting the fan hub; a side wall connected to the first wall; and an air inlet wall connected to the side wall, the air inlet wall comprising an air inlet for receiving air into the fan housing and a plurality of tabs located proximate to the air inlet and extending in a direction substantially parallel to an axis of rotation of the plurality of fan blades.

Embodiments may be directed to a chassis for an information handling system. The chassis may comprise a bottom cover having a continuous surface, a plurality of side covers, wherein at least one side cover comprises an air inlet, and a fan assembly for cooling components in the chassis. The fan assembly may comprise a fan hub coupled to a plurality of fan blades, a fan housing comprising a first wall for supporting the fan hub; a side wall connected to the first wall; and an air inlet wall comprising an opening for receiving air into the fan housing and a plurality of tabs located proximate to the opening and extending orthogonal to the air inlet wall.

In some embodiments, each tab in the plurality of tabs further extends radially inward. In some embodiments, a disc may be connected to the plurality of tabs. In some embodiments, a ring may be connected to the plurality of tabs. In some embodiments, the ring has a ring inner diameter greater than an outer diameter of the fan hub. In some embodiments, the fan hub and the plurality of fan blades comprise a concave fan, wherein each fan blade has a fan blade width that increases radially outward of the fan hub. In some embodiments, the air inlet wall is angled relative to the first wall based on the fan blade width.

BRIEF DESCRIPTION OF THE DRAWINGS

For a more complete understanding of the present disclosure and its features/advantages, reference is now made to the following description, taken in conjunction with the accompanying drawings, which are not drawn to scale, and in which.

DETAILED DESCRIPTION

In the following description, details are set forth by way of example to facilitate discussion of the disclosed subject matter. It should be apparent to a person of ordinary skill in the field, however, that the disclosed embodiments are examples and not exhaustive of all possible embodiments.

As used herein, a reference numeral refers to a class or type of entity, and any letter following such reference numeral refers to a specific instance of a particular entity of that class or type. Thus, for example, a hypothetical entity referenced by '12A' may refer to a particular instance of a particular class/type, and the reference '12' may refer to a collection of instances belonging to that particular class/type or any one instance of that class/type in general.

An information handling system (IHS) may include a hardware resource or an aggregate of hardware resources operable to compute, classify, process, transmit, receive, retrieve, originate, switch, store, display, manifest, detect, record, reproduce, handle, and/or utilize various forms of information, intelligence, or data for business, scientific, control, entertainment, or other purposes, according to one or more embodiments. For example, an IHS may be a personal computer, a desktop computer system, a laptop computer system, a server computer system, a mobile device, a tablet computing device, a personal digital assistant (PDA), a consumer electronic device, an electronic music player, an electronic camera, an electronic video player, a wireless access point, a network storage device, or another suitable device and may vary in size, shape, performance, functionality, and price. In one or more embodiments, a portable IHS may include or have a form factor of that of or similar to one or more of a laptop, a notebook, a telephone, a tablet, and a PDA, among others. For example, a portable IHS may be readily carried and/or transported by a user (e.g., a person). In one or more embodiments, components of an IHS may include one or more storage devices, one or more communications ports for communicating with external devices as well as various input and output (I/O) devices, such as a keyboard, a mouse, and a video display, among others. In one or more embodiments, IHS may include one or more buses operable to transmit communication between or among two or more hardware components. In one example, a bus of an IHS may include one or more of a memory bus, a peripheral bus, and a local bus, among others. In another example, a bus of an IHS may include one or more of a Micro Channel Architecture (MCA) bus, an Industry Standard Architecture (ISA) bus, an Enhanced ISA (EISA) bus, a Peripheral Component Interconnect (PCI) bus, HyperTransport (HT) bus, an inter-integrated circuit ($I^2C$) bus, a serial peripheral interface (SPI) bus, a low pin count (LPC) bus, an enhanced serial peripheral interface (eSPI) bus, a universal serial bus (USB), a system management bus (SMBus), and a Video Electronics Standards Association (VESA) local bus, among others.

In one or more embodiments, an IHS may include firmware that controls and/or communicates with one or more hard drives, network circuitry, one or more memory devices, one or more I/O devices, and/or one or more other peripheral devices. For example, firmware may include software embedded in an IHS component utilized to perform tasks. In one or more embodiments, firmware may be stored in non-volatile memory, such as storage that does not lose stored data upon loss of power. In one example, firmware associated with an IHS component may be stored in non-volatile memory that is accessible to one or more IHS components. In another example, firmware associated with an IHS component may be stored in non-volatile memory that may be dedicated to and includes part of that component. For instance, an embedded controller may include firmware that may be stored via non-volatile memory that may be dedicated to and includes part of the embedded controller.

An IHS may include a processor, a volatile memory medium, non-volatile memory media, an I/O subsystem, and a network interface. Volatile memory medium, non-volatile memory media, I/O subsystem, and network interface may be communicatively coupled to processor. In one or more embodiments, one or more of volatile memory medium, non-volatile memory media, I/O subsystem, and network interface may be communicatively coupled to processor via one or more buses, one or more switches, and/or one or more root complexes, among others. In one example, one or more of a volatile memory medium, non-volatile memory media, an I/O subsystem, and a network interface may be communicatively coupled to the processor via one or more PCI-Express (PCIe) root complexes. In another example, one or more of an I/O subsystem and a network interface may be communicatively coupled to processor via one or more PCIe switches.

In one or more embodiments, the term "memory medium" may mean a "storage device", a "memory", a "memory device", a "tangible computer readable storage medium", and/or a "computer-readable medium". For example, computer-readable media may include, without limitation, storage media such as a direct access storage device (e.g., a hard disk drive, a floppy disk, etc.), a sequential access storage device (e.g., a tape disk drive), a compact disk (CD), a CD-ROM, a digital versatile disc (DVD), a random access memory (RAM), a read-only memory (ROM), a one-time programmable (OTP) memory, an electrically erasable programmable read-only memory (EEPROM), and/or a flash memory, a solid state drive (SSD), or any combination of the foregoing, among others.

In one or more embodiments, one or more protocols may be utilized in transferring data to and/or from a memory medium. For example, the one or more protocols may include one or more of small computer system interface (SCSI), Serial Attached SCSI (SAS) or another transport that operates with the SCSI protocol, advanced technology attachment (ATA), serial ATA (SATA), a USB interface, an Institute of Electrical and Electronics Engineers (IEEE) 1394 interface, a Thunderbolt interface, an advanced technology attachment packet interface (ATAPI), serial storage architecture (SSA), integrated drive electronics (IDE), or any combination thereof, among others.

A volatile memory medium may include volatile storage such as, for example, RAM, DRAM (dynamic RAM), EDO RAM (extended data out RAM), SRAM (static RAM), etc. One or more of non-volatile memory media may include nonvolatile storage such as, for example, a read only memory (ROM), a programmable ROM (PROM), an erasable PROM (EPROM), an electrically erasable PROM, NVRAM (non-volatile RAM), ferroelectric RAM (FRAM), a magnetic medium (e.g., a hard drive, a floppy disk, magnetic tape, etc.), optical storage (e.g., a CD, a DVD, a BLU-RAY disc, etc.), flash memory, a SSD, etc. In one or more embodiments, a memory medium can include one or more volatile storages and/or one or more nonvolatile storages.

In one or more embodiments, a network interface may be utilized in communicating with one or more networks and/or one or more other information handling systems. In one example, network interface may enable an IHS to communicate via a network utilizing a suitable transmission protocol and/or standard. In a second example, a network interface may be coupled to a wired network. In a third example, a network interface may be coupled to an optical network. In another example, a network interface may be coupled to a wireless network. In one instance, the wireless network may include a cellular telephone network. In a second instance, the wireless network may include a satellite telephone network. In another instance, the wireless network may include a wireless Ethernet network (e.g., a Wi-Fi network, an IEEE 802.11 network, etc.).

In one or more embodiments, a network interface may be communicatively coupled via a network to a network storage resource. For example, the network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, an Internet or another appropriate architecture or system that facilitates the communication of signals, data and/or messages (generally referred to as data). For instance, the network may transmit data utilizing a desired storage and/or communication protocol, including one or more of Fibre Channel, Frame Relay, Asynchronous Transfer Mode (ATM), Internet protocol (IP), other packet-based protocol, Internet SCSI (iSCSI), or any combination thereof, among others.

In one or more embodiments, a processor may execute processor instructions in implementing at least a portion of one or more systems, at least a portion of one or more flowcharts, at least a portion of one or more methods, and/or at least a portion of one or more processes. In one example, a processor may execute processor instructions from one or more memory media in implementing at least a portion of one or more systems, at least a portion of one or more flowcharts, at least a portion of one or more methods, and/or at least a portion of one or more processes. In another example, a processor may execute processor instructions via a network interface in implementing at least a portion of one or more systems, at least a portion of one or more flowcharts, at least a portion of one or more methods, and/or at least a portion of one or more processes.

In one or more embodiments, a processor may include one or more of a system, a device, and an apparatus operable to interpret and/or execute program instructions and/or process data, among others, and may include one or more of a microprocessor, a microcontroller, a digital signal processor (DSP), an application specific integrated circuit (ASIC), and another digital or analog circuitry configured to interpret and/or execute program instructions and/or process data, among others. In one example, a processor may interpret and/or execute program instructions and/or process data stored locally (e.g., via memory media and/or another component of an IHS). In another example, a processor may interpret and/or execute program instructions and/or process data stored remotely (e.g., via a network storage resource).

In one or more embodiments, an I/O subsystem may represent a variety of communication interfaces, graphics interfaces, video interfaces, user input interfaces, and/or peripheral interfaces, among others. For example, an I/O subsystem may include one or more of a touch panel and a display adapter, among others. For instance, a touch panel may include circuitry that enables touch functionality in conjunction with a display that is driven by a display adapter.

A non-volatile memory medium may include an operating system (OS) and applications (APPs). In one or more embodiments, one or more of an OS and APPs may include processor instructions executable by a processor. In one example, a processor may execute processor instructions of one or more of OS and APPs via a non-volatile memory medium. In another example, one or more portions of the processor instructions of one or more of an OS and APPs may be transferred to a volatile memory medium and a processor may execute the one or more portions of the processor instructions.

Non-volatile memory medium may include information handling system firmware (IHSFW). In one or more embodiments, IHSFW may include processor instructions executable by a processor. For example, IHSFW may include one or more structures and/or one or more functionalities of and/or compliant with one or more of a basic input/output system (BIOS), an Extensible Firmware Interface (EFI), a Unified Extensible Firmware Interface (UEFI), and an Advanced Configuration and Power Interface (ACPI), among others. In one instance, a processor may execute processor instructions of IHSFW via non-volatile memory medium. In another instance, one or more portions of the processor instructions of IHSFW may be transferred to volatile memory medium, and processor may execute the one or more portions of the processor instructions of IHSFW via volatile memory medium.

Common Portable Chassis Designs have a Bottom Cover with a Vent

Figure 1:
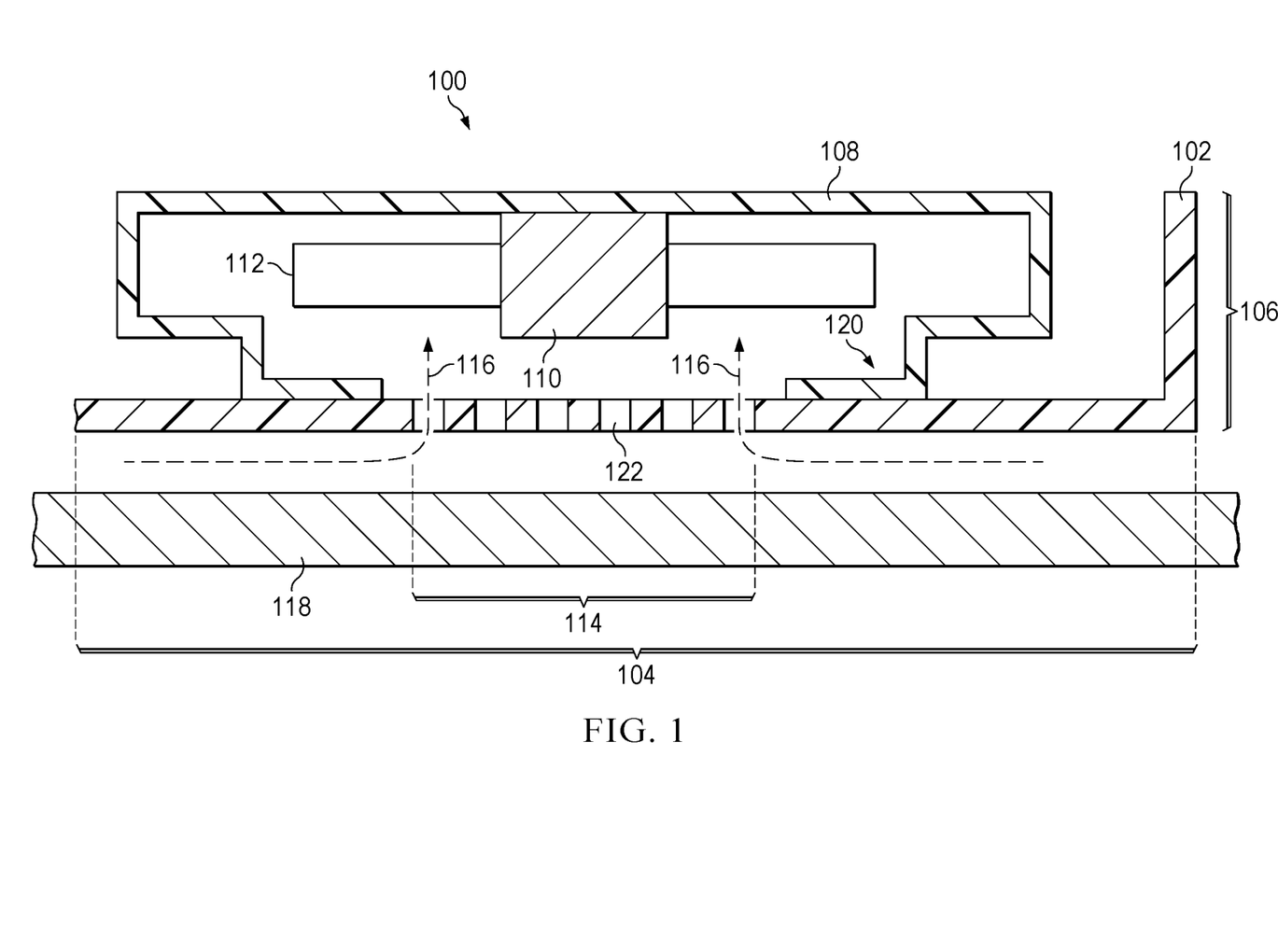
FIG. 1 depicts an example chassis of a portable information handling system having a bottom vent for receiving airflow from an ambient environment.

Referring to FIG. 1, a portable chassis 100 containing an information handling system typically comprises bottom cover 104 coupled to two or more side covers 106. For cooling an information handling system in chassis 100, fan housing 108 comprises first wall 108a and one or more side walls 108b, wherein first wall 108 may support fan hub 110 and the one or more side walls 108b may protect a plurality of fan blades 112. Airflow 116 may enter fan housing 108 through fan inlet opening 114.

As used herein, the terms "bottom" and "side" or "sides" may refer to a common orientation of a portable chassis, wherein a portable chassis (e.g., a laptop) 100 with a plurality of covers is generally oriented such that a cover associated with chassis 100 sitting on surface 118 is referred to as a bottom cover and other covers may be referred to as side covers or a top cover.

A force applied to bottom cover 104 may cause bottom cover 104 to deflect, particularly if the material used to form bottom cover 104 is a resilient material (e.g., plastic). To prevent damage to fan blades 112, fan blades 112 may be recessed in fan housing 108, and fan housing 108 may comprise fan shroud 120 extending radially inward of side walls 108b and in contact with bottom cover 104. Fan shroud 120 may contact bottom cover 104 to prevent a force applied on bottom cover 104 from deflecting bottom cover 104 into contact with fan blades 112.

Bottom cover 104 may be formed with vent 122, which may prevent debris from entering fan inlet opening 114 and may further limit how much bottom cover 104 may be deflected before contact with fan blades 112. As depicted in FIG. 1, fan blades 112 may have a uniform blade width profile such that a fan blade width is constant over the fan blade length (e.g., the fan blade width at an innermost radius near fan hub 110 may equal the fan blade width at an outermost radius of the fan blade 112.

No-Vent Chassis for Concave Fans

Figure 2:
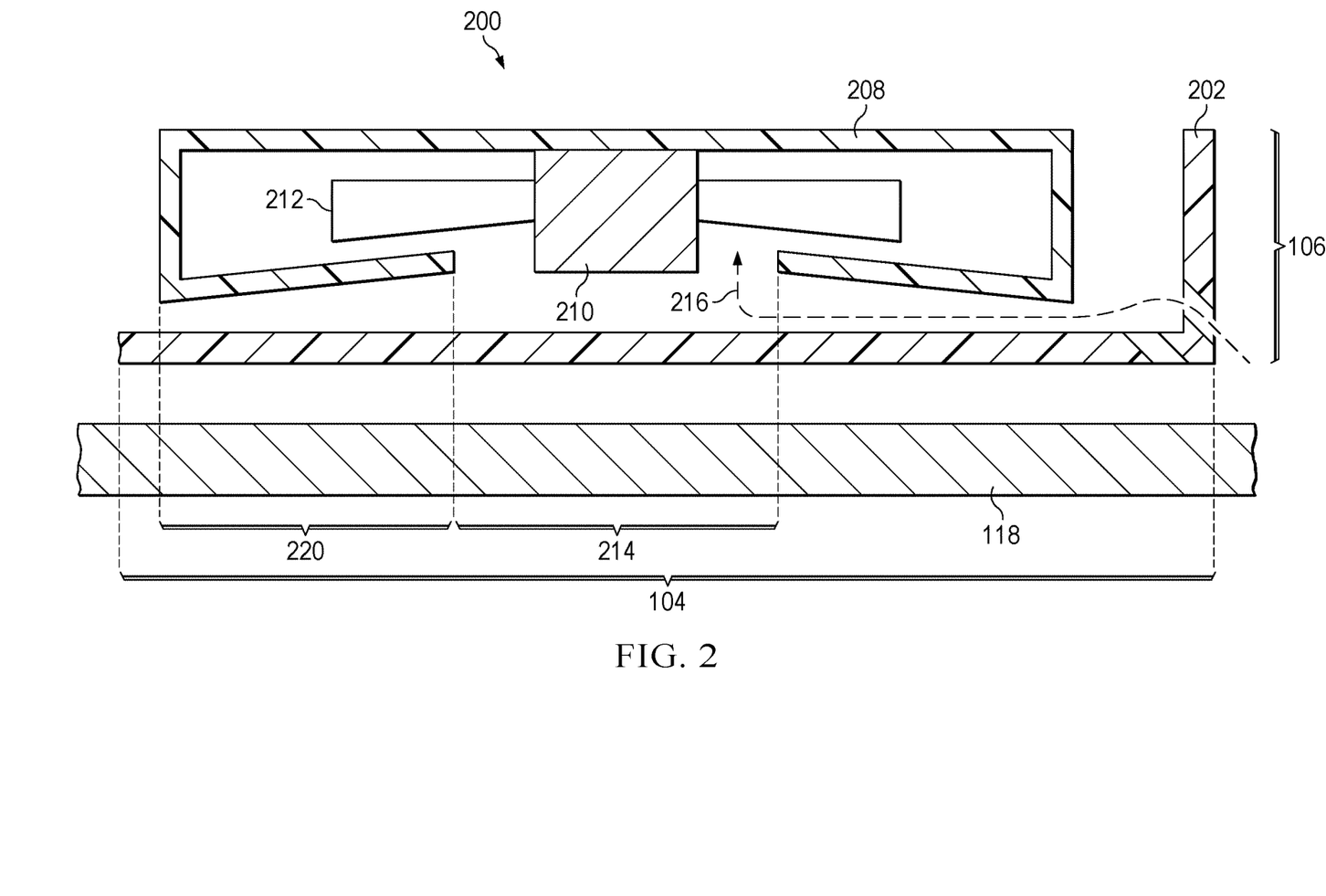
FIG. 2 depicts an example chassis of a portable information handling system having side vents for receiving airflow from an ambient environment but without a bottom vent.

Referring to FIG. 2, chassis 200 for containing an information handling system in a mobile device may comprise bottom cover 204 and a plurality of side covers 206, in which one or more side covers 206 may have one or more chassis air inlets 202 and bottom cover 204 may be formed with a continuous surface (e.g., without vent 122 as depicted in FIG. 1). Fan housing 208 may comprise first wall 208a and one or more side walls 208b, wherein first wall 108 may support fan hub 110 and the one or more side walls 108b may protect a plurality of fan blades 212. Airflow 216 may enter fan housing 208 through fan inlet opening 214.

Fan hub 110 and fan blades 212 may form part of a concave fan, wherein fan blades 212 may have a fan blade length to define a fan diameter but have a non-uniform blade width. For example, fan blades 212 depicted in FIG. 2 may have a fan blade width that increases radially outward of fan hub 110.

To improve airflow in a concave fan, fan housing 208 may be configured with fan shroud 220 that is angled (e.g., non-parallel) relative to first wall 208a based on the fan blade width. Advantageously, chassis 200 such as depicted in FIG. 2 with fan shroud 220 that is angled relative to first wall 208a can dramatically reduce the high air flow impedance between fan blades 212 and bottom cover 204, allowing some relatively lower power cooling systems to not have a large bottom vent (e.g., without vent 122 as depicted in FIG. 1) without sacrificing the cooling performance. Chassis 200 without a bottom vent may provide a premium style for a mobile device (e.g., a laptop) and may also reduce or eliminate intake vent blocking problems when the mobile device is positioned or oriented on certain surfaces 118 (e.g., on a user's lap).

Figure 3:
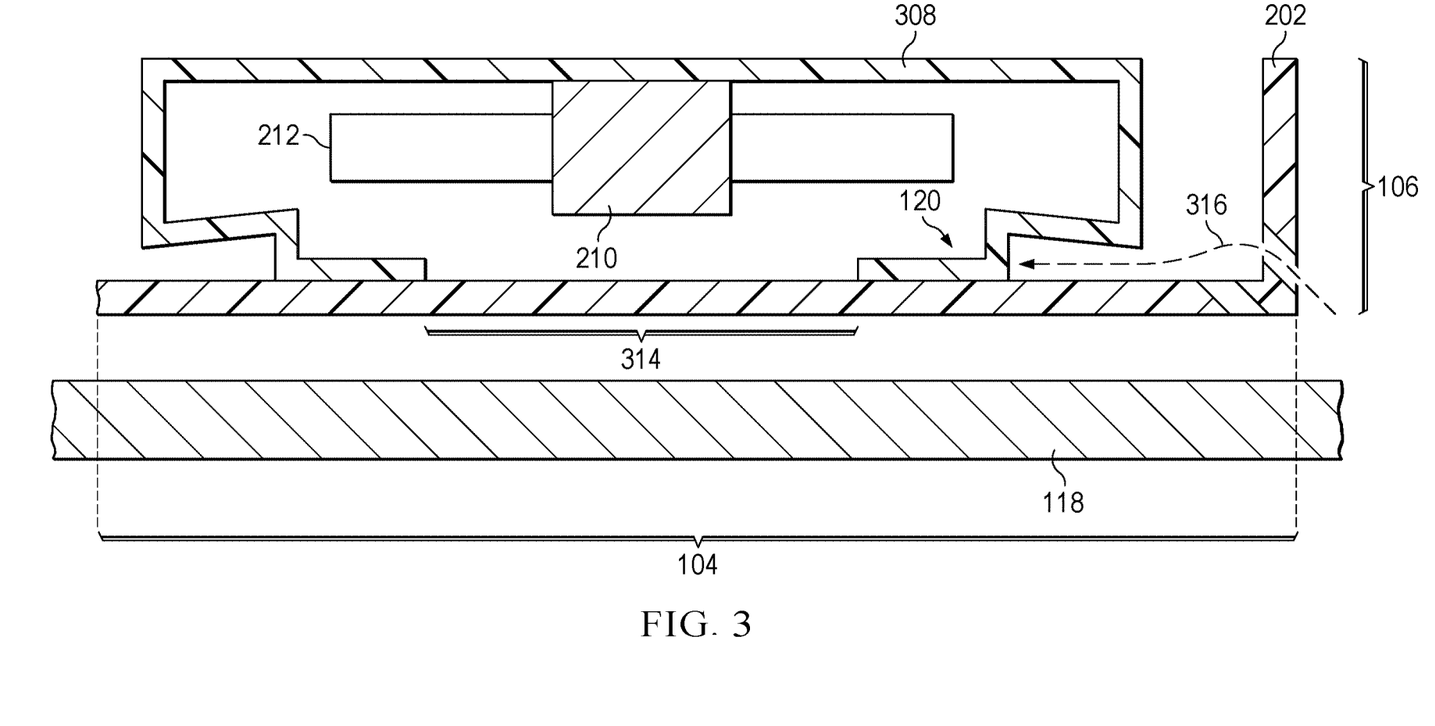
FIG. 3 depicts the example chassis of a portable information handling system depicted in FIG. 2 with a bottom support that inhibits airflow to a fan.

Turning to FIG. 3, although a concave fan can provide a significant thermal benefit, the need for airflow via one or more chassis air inlets 202 results in a mechanical challenge for bottom covers 204 formed from more resilient materials (e.g., plastics), particularly in the area near fan inlet 214. For a laptop chassis with traditional bottom fan inlet and a non-concave fan (e.g., chassis 100 in FIG. 1), a typical solution may be to add embosses to fan shroud 120, strengthening fan shroud 120 and therefore reducing its deformation under the load. However, in a no-bottom-vent design, air flow 216 must go through the narrow channel between fan housing 208 and bottom cover 204. Adding embosses on fan housing 308 will block air flow 216.

Embodiments disclosed herein may include a fan housing with a plurality of tabs located proximate a fan inlet opening. The tabs may extend in a direction substantially parallel with an axis of rotation of fan blades such that deflection of the bottom cover contacts the tabs instead of the fan blades. In some embodiments, the plurality of tabs may contact a bottom cover.

Embodiments may include a support structure on a fan housing comprising a plurality of tabs at the edge of the fan inlet opening and may further include a ring or disc that is connected to the tabs within the fan inlet opening. Advantageously, a mechanical support located proximate a fan inlet opening may significantly reduce the support distance and therefore greatly increase the amount of force that can be tolerated before the bottom cover touches a fan hub or fan blades.

Tabs Extend to Protect Fan Blades from a Deflection of a Chassis Bottom Cover

Figure 4:
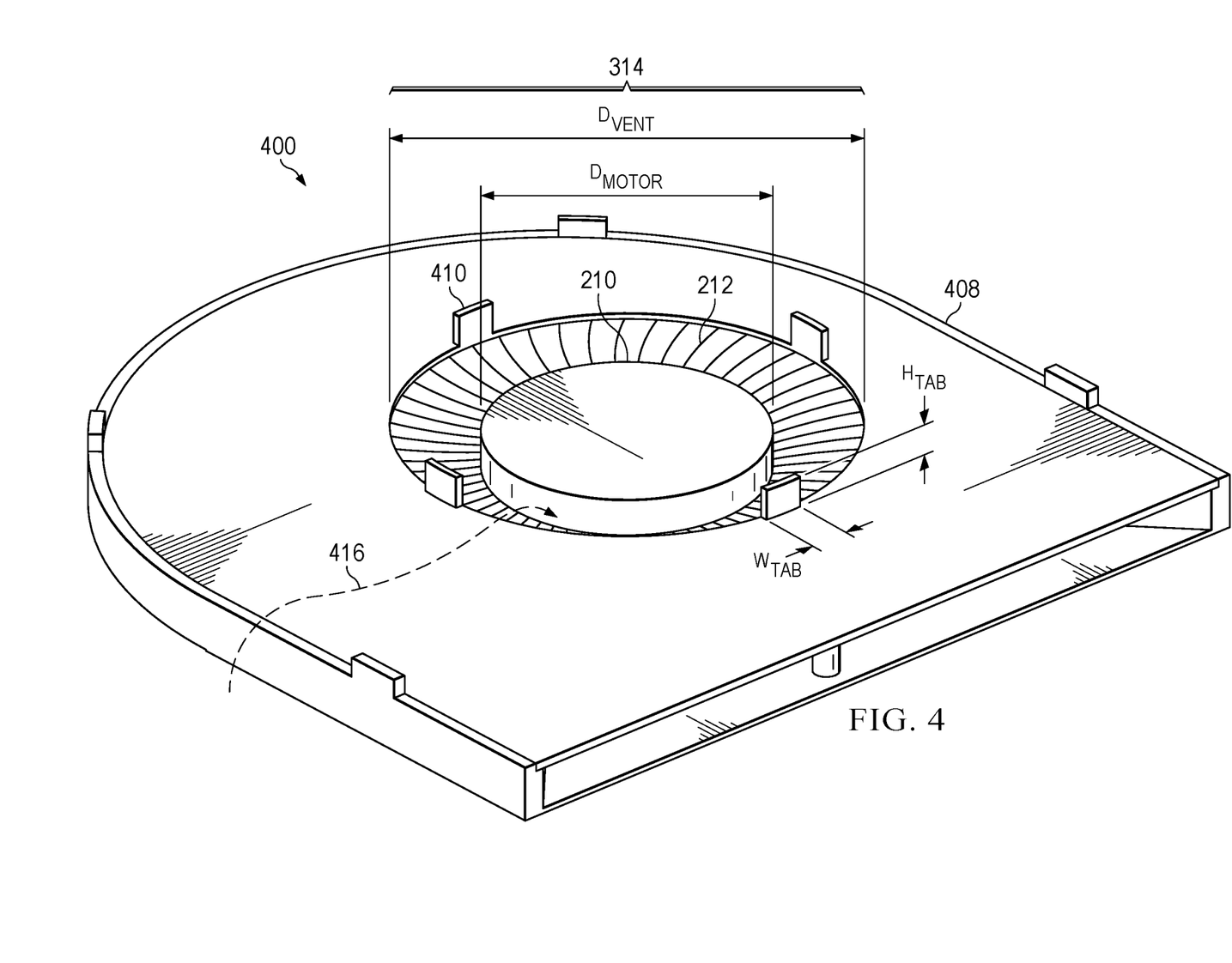
FIG. 4 depicts one embodiment of a mechanical support for a fan.

Turning to FIG. 4, embodiments of a cooling system for a portable chassis may comprise fan housing 400 for supporting fan hub 110 and a plurality of fan blades 212. Fan housing 400 may be formed with first wall 408a for supporting fan hub 110 and a plurality of fan blades 212, one or more side walls 408 coupled to first wall 408a, and fan shroud 420 coupled to side walls 408b. Fan hub 110 rotates fan blades 212 to draw airflow 216 into fan housing 400 through fan inlet 214 and airflow 216 exits fan housing 400 through exit 416.

Fan shroud 420 may be formed as a generally smooth surface (e.g., no embosses) to minimize negative effects on airflow 216. Fan shroud 420 may be formed with fan inlet 214 positioned near fan hub 110 to allow airflow 216 into fan housing 400. Fan shroud 420 may further comprise a plurality of tabs 410 positioned proximate fan inlet 214. Tabs 410 may extend a height ($H_{TAB}$) in a direction substantially parallel with an axis of rotation (R) associated with fan hub 110, wherein the height ensures any deflection of bottom cover 204 contacts tabs 410 before contacting fan hub 110 or fan blades 212. Each tab 410 may have a width ($W_{TAB}$) to minimize any negative effect of positioning tabs 410 in airflow 216.

Figure 5:
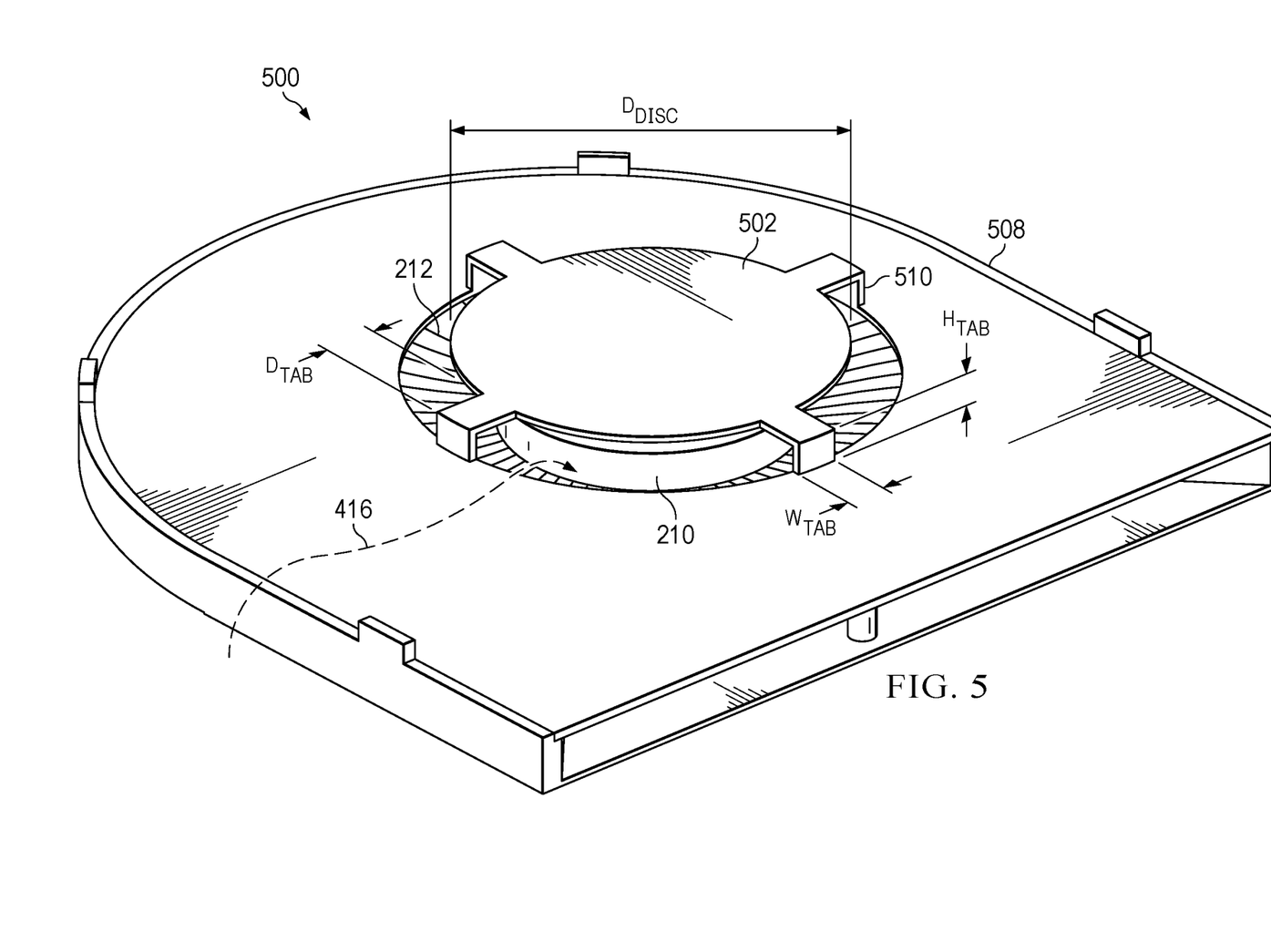
FIG. 5 depicts one embodiment of a mechanical support for a fan with a central disc.

Disc Coupled to Tabs Further Protects Fan Blades from a Deflection of a Chassis Bottom Cover Turning to FIG. 5, embodiments of a cooling system for a portable chassis may comprise fan housing 500 for supporting fan hub 110 and a plurality of fan blades 212. Fan housing 500 may be formed with first wall 508a for supporting fan hub 110 and a plurality of fan blades 212, one or more side walls 508b coupled to first wall 508a, and fan shroud 520 coupled to side walls 508b. Fan hub 110 rotates fan blades 212 to draw airflow 216 into fan housing 500 through fan inlet 214 and airflow 216 exits fan housing 500 through exit 416.

Fan shroud 520 may be formed as a generally smooth surface (e.g., no embosses) to minimize negative effects on airflow 216. Fan shroud 520 may be formed with fan inlet 214 positioned near fan hub 110 to allow airflow 216 into fan housing 500. Fan shroud 520 may further comprise a plurality of tabs 510 positioned proximate fan inlet 214. Tabs 510 may extend a height ($H_{TAB}$) in a direction substantially parallel with an axis of rotation (R) associated with fan hub 110, wherein the height ensures any deflection of bottom cover 204 contacts tabs 510 before contacting fan hub 110 or fan blades 212. Each tab 510 may have a width ($W_{TAB}$) to minimize any negative effect of positioning tabs 510 in airflow 216.

In some embodiments, fan housing 500 comprises disc 502 coupled to tabs 510, wherein disc 502 may have a disc diameter less than a diameter of fan inlet 214. In some embodiments, disc 502 may have a disc diameter that is less than an outer diameter of fan hub 110. In some embodiments, tabs 510 may be configured such that a force applied to disc 502 causes a deflection of tabs 510 to cause disc 502 to contact fan hub 110. Disc 502 coupled to tabs 510 may limit how much bottom cover 204 can be deflected since disc 502 may contact fan hub 110.

Figure 6:
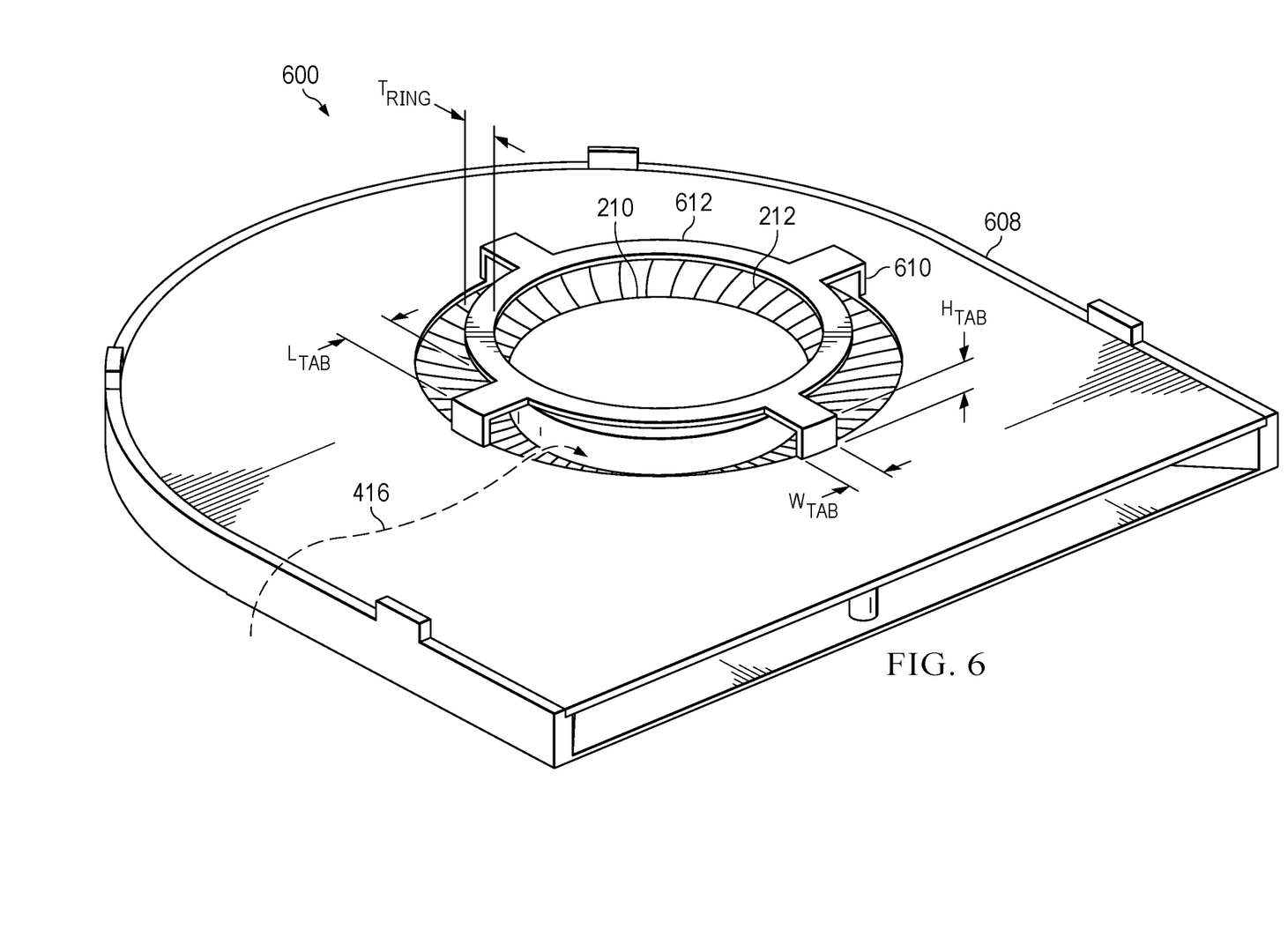
FIG. 6 depicts one embodiment of a mechanical support for a fan with a ring.

A Ring Coupled to Tabs Further Protects Fan Blades from a Larger Deflection of a Chassis Bottom Cover Turning to FIG. 6, embodiments of a cooling system for a portable chassis may comprise fan housing 600 for supporting fan hub 110 and a plurality of fan blades 212. Fan housing 600 may be formed with first wall 608a for supporting fan hub 110 and a plurality of fan blades 212, one or more side walls 608b coupled to first wall 608a, and fan shroud 620 coupled to side walls 608b. Fan hub 110 rotates fan blades 212 to draw airflow 216 into fan housing 600 through fan inlet 214 and airflow 216 exits fan housing 500 through exit 416.

Fan shroud 620 may be formed as a generally smooth surface (e.g., no embosses) to minimize negative effects on airflow 216. Fan shroud 620 may be formed with fan inlet 214 positioned near fan hub 110 to allow airflow 216 into fan housing 600. Fan shroud 620 may further comprise a plurality of tabs 610 positioned proximate fan inlet 214. Tabs 610 may extend a height ($H_{TAB}$) in a direction substantially parallel with an axis of rotation (R) associated with fan hub 110, wherein the height ensures any deflection of bottom cover 204 contacts tabs 610 before contacting fan hub 110 or fan blades 212. Each tab 610 may have a width ($W_{TAB}$) to minimize any negative effect of positioning tabs 610 in airflow 216.

In some embodiments, fan housing 600 may comprise ring 602 coupled to tabs 610, wherein ring 602 has an outer diameter and an inner diameter. In some embodiments, tabs 610 may be configured from a resilient material such that a force applied to bottom cover 204 causes bottom cover 204 to contact ring 602. In some embodiments, the inner diameter of ring 602 may be configured such that, if a force is applied to bottom cover 204 to deflect tabs 610, ring 602 may be positioned around fan hub 110 (e.g., fan hub 110 may start to pass through ring 602). Thus, embodiments of fan housing 600 may allow for greater deflection of bottom cover 204 than embodiments of fan housing 500.

All Designs Improve Over Existing Approaches

Embodiments may greatly increase the structural support to protect fan blades 212 from contact with bottom cover 20. Referring to Chart 1, finite element analysis (FEA) simulations indicate all embodiments described above exceed a pogo test requirement of withstanding at least 10 Kg of force applied to bottom cover 204.

CHART 1

| CONFIG-URATION | DESCRIPTION | MAXIMUM POGO FORCE ALLOWED (KG) |
|---|---|---|
| 1 | NO EMBOSSES AND NO SUPPORT | 5.7 |

CHART 1-continued

| CONFIG-URATION | DESCRIPTION | MAXIMUM POGO FORCE ALLOWED (KG) |
|---|---|---|
| | STRUCTURE (FIG. 2) | |
| 2 | NO EMBOSSES, TABS ON FAN SHROUD (FIG. 4) | 14.5 |
| 3 | NO EMBOSSES, TABS ON FAN SHROUD + DISC (FIG. 5) | 11.2 |
| 4 | NO EMBOSSES, TABS ON FAN SHROUD + RING (FIG. 6) | 16.1 |

As indicated by the results in Chart 1, a fan assembly configured with no supports (e.g., fan housing 200 depicted in FIG. 2) may tolerate only about 5.7 Kg of force before bottom cover 204 contacts fan hub 110 or fan blades 212. However, embodiments described herein may be configured to tolerate at least 10 Kg of force. For example, configuration 3 may tolerate approximately 11.2 Kg of force before disc 502 contacts fan fub 210, configuration 2 may tolerate approximately 14.5 Kg of force before fan shroud 420 contacts fan blades 212 and configuration 4 may tolerate approximately 16.1 Kg of force before fan shroud 620 contacts fan blades 212.

Referring to Chart 2, finite element analysis (FEA) for an embodiment similar to the embodiment depicted in FIG. 6 was compared against actual test results for a fan assembly without support (e.g., fan assembly 200 in FIG. 2). For materials, bottom cover 204 was defined with a modulus of 12 GPa, fan housing 408 was defined as 0.4 mm thick steel, the fan housing side walls were defined as PC/ABS plastic with a modulus of 2 GPa and the fan base is steel. For the test, a pogo rod of 10 mm diameter was used to deflect a bottom cover 204 a maximum of 1.3 mm (until bottom cover 204 was within 1.0 mm of fan hub 110).

CHART 2

| CONFIG-URATION | DESCRIPTION | FEA-BASED MAXIMUM ACCEPTABLE POGO FORCE (KG) | TEST RESULTS IN A CHASSIS (KG) |
|---|---|---|---|
| 1 | Concave fan without any support structure | 2.4 | 2.0 to 2.5 |
| 2 | Concave fan with tabs (e.g., FIG. 4) | 8.4 | 9.0 to 10.5 |

The FEA simulation results matched reasonably well with actual measured data for the embodiment depicted in FIG. 4. Accordingly, the FEA results for other embodiments are expected to be similarly accurate.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A fan assembly, comprising:
a fan hub coupled to a plurality of fan blades;
a fan housing comprising:
a first wall for supporting the fan hub;
a side wall connected to the first wall; and
an air inlet wall connected to the side wall, the air inlet wall comprising an air inlet for receiving air into the fan housing and a plurality of tabs located proximate to the air inlet and extending in a direction substantially parallel to an axis of rotation of the plurality of fan blades, each of the plurality of tabs i) extending a distance from the air inlet wall such that an end of each of the tabs is spaced-apart from the air inlet wall a height, ii) each of the tabs extending a width along the air inlet wall, and iii) each of the tabs having a thickness, wherein the width of each respective tab is greater than the thickness of each respective tab, wherein the end of each of the plurality of tabs is free of any structural element directly connecting the tab to each remaining tab of the plurality of tabs, wherein each of the tabs are located proximate to the air inlet including each of the tabs surrounding the air inlet, with the width of each of the tabs extending along a circumference of the air inlet.

2. The fan assembly of claim 1, wherein each tab in the plurality of tabs further extends radially inward.

3. The fan assembly of claim 1, wherein the fan hub and the plurality of fan blades comprise a concave fan, wherein each fan blade has a fan blade width that increases radially outward of the fan hub.

4. A chassis for an information handling system, the chassis comprising:
a bottom cover having a continuous surface;
a plurality of side covers, wherein at least one side cover comprises an air inlet; and
a fan assembly for cooling components in the chassis, the fan assembly comprising:
a fan hub coupled to a plurality of fan blades;
a fan housing comprising:
a first wall for supporting the fan hub;
a side wall connected to the first wall; and
an air inlet wall comprising an opening for receiving air into the fan housing and a plurality of tabs located proximate to the opening and extending orthogonal to the air inlet wall, each of the plurality of tabs i) extending a distance from the air inlet wall such that an end of each of the tabs is spaced-apart from the air inlet wall a height, and ii) each of the tabs extending a width along the air inlet wall, and iii) each of the tabs having a thickness, wherein the width of each respective tab is greater than the thickness of each respective tab, wherein the end of each of the plurality of tabs is free of any structural element directly connecting the tab to each remaining tab of the plurality of tabs, wherein each of the tabs are located proximate to the air inlet including each of the tabs surrounding the air inlet, with the width of each of the tabs extending along a circumference of the air inlet.

5. The chassis of claim 4, wherein each tab in the plurality of tabs further extends radially inward.

6. The chassis of claim 4, wherein the fan hub and the plurality of fan blades comprise a concave fan, wherein each fan blade has a fan blade width that increases radially outward of the fan hub.

* * * * *